(12) United States Patent
Liu et al.

(10) Patent No.: US 8,739,806 B2
(45) Date of Patent: Jun. 3, 2014

(54) CHEMICAL MECHANICAL POLISHING SYSTEM

(75) Inventors: Li-Chung Liu, Taichung (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 447 days.

(21) Appl. No.: 13/105,874

(22) Filed: May 11, 2011

(65) Prior Publication Data

US 2012/0289128 A1     Nov. 15, 2012

(51) Int. Cl.
    *B08B 3/04*     (2006.01)
(52) U.S. Cl.
    USPC ..................................... 134/104.3; 134/104.2
(58) Field of Classification Search
    None
    See application file for complete search history.

(56) References Cited

U.S. PATENT DOCUMENTS

| 6,461,224 B1 * | 10/2002 | Frost et al. ................... 451/41 |
| 6,461,524 B1 | 10/2002 | Tsuihiji |
| 6,872,280 B2 * | 3/2005 | Tanaka et al. ............ 156/345.12 |
| 2004/0155013 A1 | 8/2004 | Sotozaki |

FOREIGN PATENT DOCUMENTS

| JP | 3852758 | 12/2006 |
| TW | 480571 | 3/2002 |
| TW | 201113944 | 4/2011 |

* cited by examiner

*Primary Examiner* — Jason Ko
(74) *Attorney, Agent, or Firm* — Winston Hsu; Scott Margo

(57) ABSTRACT

A chemical mechanical polishing (CMP) system includes a wafer polishing unit comprising a waste liquid sink for receiving a used slurry and a waste slurry drain piping for draining the used slurry; and a post-CMP cleaning unit coupled to the wafer polishing unit such that a used base chemical such as tetramethyl ammonium hydroxide (TMAH) produced from the post-CMP cleaning unit flows toward the wafer polishing unit to frequently wash at least the waste slurry drain piping in a real time fashion on a wafer by wafer basis.

7 Claims, 3 Drawing Sheets

CHEMICAL MECHANICAL POLISHING SYSTEM

BACKGROUND OF THE INVENTION

1. Field of the Invention

The present invention relates generally to a wafer processing system. More particularly, the present invention relates to an integrated chemical mechanical polishing (CMP) system including a CMP wafer polishing unit and a post-CMP cleaning unit coupled to the CMP wafer polishing unit. The inventive CMP system is capable of preventing clogs in the drain piping of the CMP wafer polishing unit.

2. Description of the Prior Art

Chemical mechanical polishing (CMP) techniques are used for planarizing material layers on a wafer in semiconductor industry. In chemical mechanical polishing, slurry is dispensed onto a polishing surface of a polishing pad. Relative movement between the polishing surface and the wafer produces a combined mechanical and chemical effect on the surface of the wafer. This process creates a highly level surface on the wafer. After CMP, the wafer is transferred to a cleaning unit and scrubbed with roller-shaped PVA brushes. During scrubbing of the wafer, a base chemical such as tetramethyl ammonium hydroxide (TMAH) is simultaneously applied onto the surface of the wafer to be cleaned.

One of the major problems facing the CMP process is the clogging in the waste slurry drain piping. It is believed that the agglomeration of abrasive particles, the base chemical crystals from the slurry and/or the polishing pad debris cause clogs in the drain pipe. The cleaning of the clogged drain pipe is time-consuming because the substances that clog the drain pipe are difficult to be removed. Extended maintenance hours may be required in order to ensure that the drain pipe is clean, which increase the down time of the CMP tool as well as the manufacture cost. Moreover, many clogs reside in remote locations in the drain pipe and it is difficult or impossible to find the clogged sites at remote locations in the drain pipe. Sometime, leakage may occur even though the CMP tool is just maintained and the drain pipe is cleaned lately.

Accordingly, there is a need in this industry to provide an improved CMP system and method that better addresses the issues of clogs in the waste slurry drain piping and leakage in the CMP tool.

SUMMARY OF THE INVENTION

It is one object of the present invention to provide an improved CMP system including a CMP wafer polishing unit and a post-CMP cleaning unit coupled to the CMP wafer polishing unit in order to solve the above-mentioned prior art problems.

To these ends, according to one aspect of the present invention, there is provided a chemical mechanical polishing (CMP) system comprising a wafer polishing unit comprising a waste liquid sink for receiving a used slurry and a waste slurry drain piping for draining the used slurry; and a post-CMP cleaning unit coupled to the wafer polishing unit such that a used base chemical such as tetramethyl ammonium hydroxide (TMAH) produced from the post-CMP cleaning unit flows toward the wafer polishing unit to frequently wash at least the waste slurry drain piping in a real time fashion on a wafer by wafer basis. In one aspect, the wafer polishing unit may comprise a platen, a polishing pad mounted on the platen, a carrier for holding and rotating a wafer, and a slurry feeding device. The post-CMP cleaning unit may comprise a plurality of rollers for supporting and rotating a wafer, a brush for scrubbing the wafer, and a spray bar disposed in proximity to the brush.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
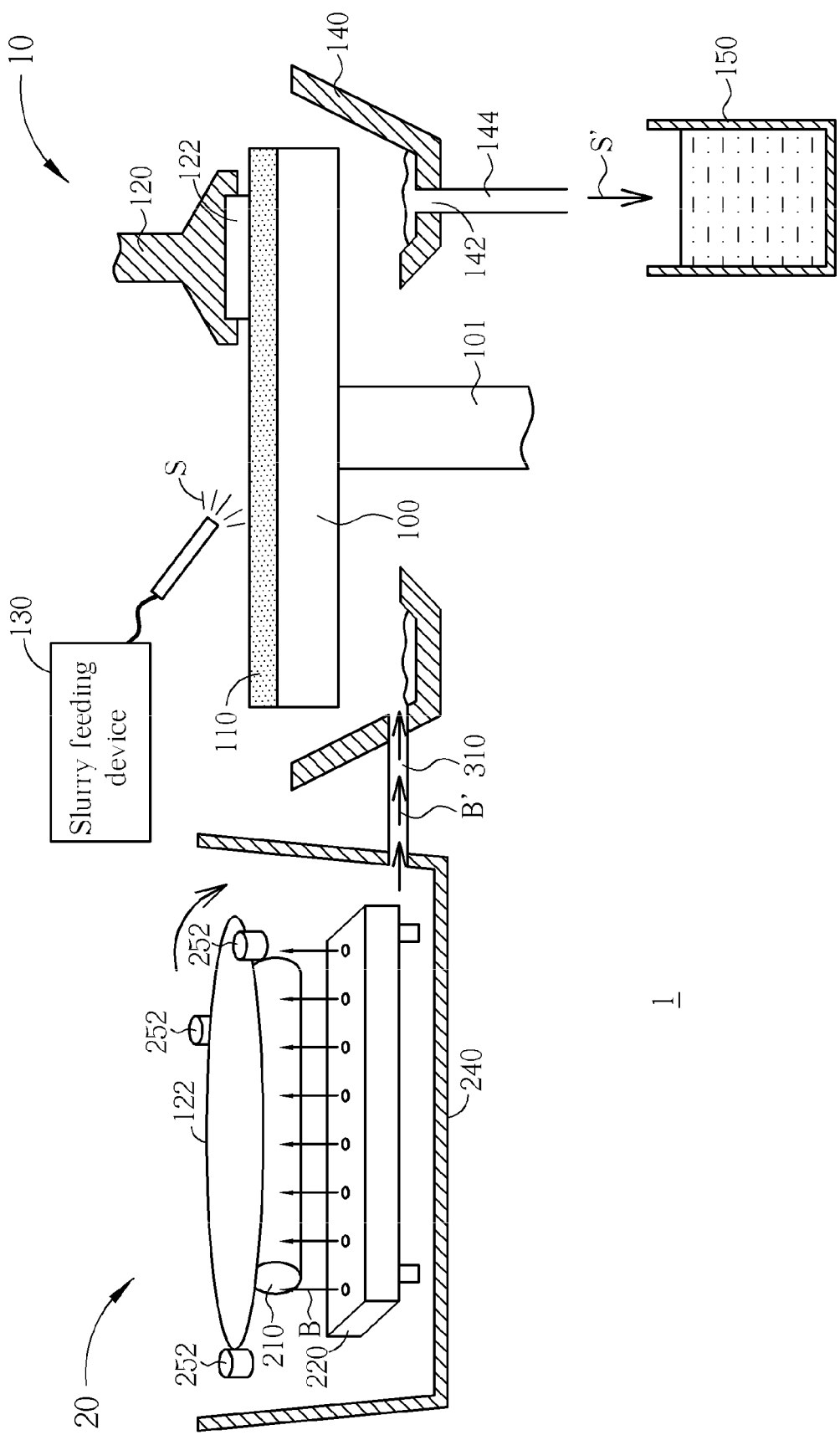
FIG. 1 is a schematic diagram showing germane parts of a CMP system in accordance with the first embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

The drawings showing embodiments of the apparatus are semi-diagrammatic and not to scale and, particularly, some of the dimensions are for the clarity of presentation and are shown exaggerated in the figures. Also, where multiple embodiments are disclosed and described having some features in common, for clarity and ease of illustration and description thereof like or similar features one to another will ordinarily be described with like reference numerals.

FIG. 1 depicts a CMP system 1 in accordance with the first embodiment of the present invention. As shown in FIG. 1, the CMP system 1 comprises at least a CMP wafer polishing unit 10 and a post-CMP cleaning unit 20, which may be configured together inside a cluster CMP tool, but not limited thereto. In general, the CMP wafer polishing unit 10 may comprise a platen 100 connected to a shaft 101 for rotating the platen 100 about its central axis during CMP process. A polishing pad 110 is mounted on the platen 100. A wafer 122 is held and rotated by a carrier 120. In polishing, a slurry feeding device 130 may spray slurry S onto the polishing pad 110. The rotating wafer 122 is pressed against the polishing pad 110 by the carrier 120 to cause relative movement between the polishing surface of the polishing pad 110 and the wafer 122, thereby producing a combined mechanical and chemical effect on the surface of the wafer. The once-used slurry S' may be received by a waste liquid sink 140 and then stored in a waste liquid tank 150 through the waste slurry drain piping 144.

As previously mentioned, the agglomeration or precipitation of abrasive particles and base chemical crystals originated from the slurry S and the polishing pad debris causes clogs in the waste slurry drain piping 144 or clogs near the drain outlet 142. The cleaning of the clogged waste slurry drain piping 144 is time-consuming because the substances that clog the waste slurry drain piping 144 are difficult to be removed. Extended maintenance hours may be required in order to ensure that the waste slurry drain piping 144 is clean, which increase the down time of the CMP tool as well as the manufacture cost. Moreover, many clogs reside in remote locations in the waste slurry drain piping 144 and it is difficult or impossible to find the clogged sites at remote locations therein. Sometime, leakage may occur even though the CMP tool is just maintained and the waste slurry drain piping 144 is cleaned lately. The present invention addresses this issue.

Still referring to FIG. 1, the post-CMP cleaning unit 20 may be a single-sided or double-sided scrubber cleaner. After polishing, the wafer 122 is transferred to the post-CMP cleaning unit 20. In the post-CMP cleaning unit 20, the wafer 122 may be held and rotated by a plurality of rollers 252 with its surface to be cleaned facing the roller-shaped brush 210. The wafer 122 is scrubbed by the brush 210 to remove the slurry residues from the wafer surface. During the scrubbing and cleaning process, a base chemical B such as tetramethyl ammonium hydroxide (TMAH) is simultaneously applied onto the surface of the wafer to be cleaned. The base chemical B enhances the cleaning ability and helps remove the slurry abrasives or particles adhered or adsorbed to the wafer surface. Typically, the base chemical B is sprayed by a spray bar 220 that is disposed in proximity to the brush 210. The once-used base chemical B' is received by the waste liquid sink 240.

According to the first embodiment of the invention, the waste liquid sink 240 of the post-CMP cleaning unit 20 communicates with the waste liquid sink 140 of the CMP wafer polishing unit 10 via a conduit 310 such that the once-used base chemical B' can be drained by gravity from the waste liquid sink 240 of the post-CMP cleaning unit 20 to the waste liquid sink 140 of the CMP wafer polishing unit 10 when scrubbing the wafer 122. By providing such configuration, the waste liquid sink 140 and the waste slurry drain piping 144 of the CMP wafer polishing unit 10 can be washed by the once-used base chemical B' every time the post-CMP cleaning unit 20 is operated, thereby preventing agglomeration or precipitation of abrasive particles and base chemical crystals and the polishing pad debris in the waste slurry drain piping 144 or clogs near the drain outlet 142.

It is advantageous to use the present invention because the cleaning of the waste liquid sink 140 and the waste slurry drain piping 144 of the CMP wafer polishing unit 10 is performed in a real time fashion and is frequently performed on a wafer by wafer basis without the need to halt the CMP process. In addition, since the waste slurry drain piping 144 is regularly maintained in a clean condition, the down time for the CMP system due to preventative maintenance (PM) can be significantly reduced and also the risk of leakage can be avoided.

Figure 2:
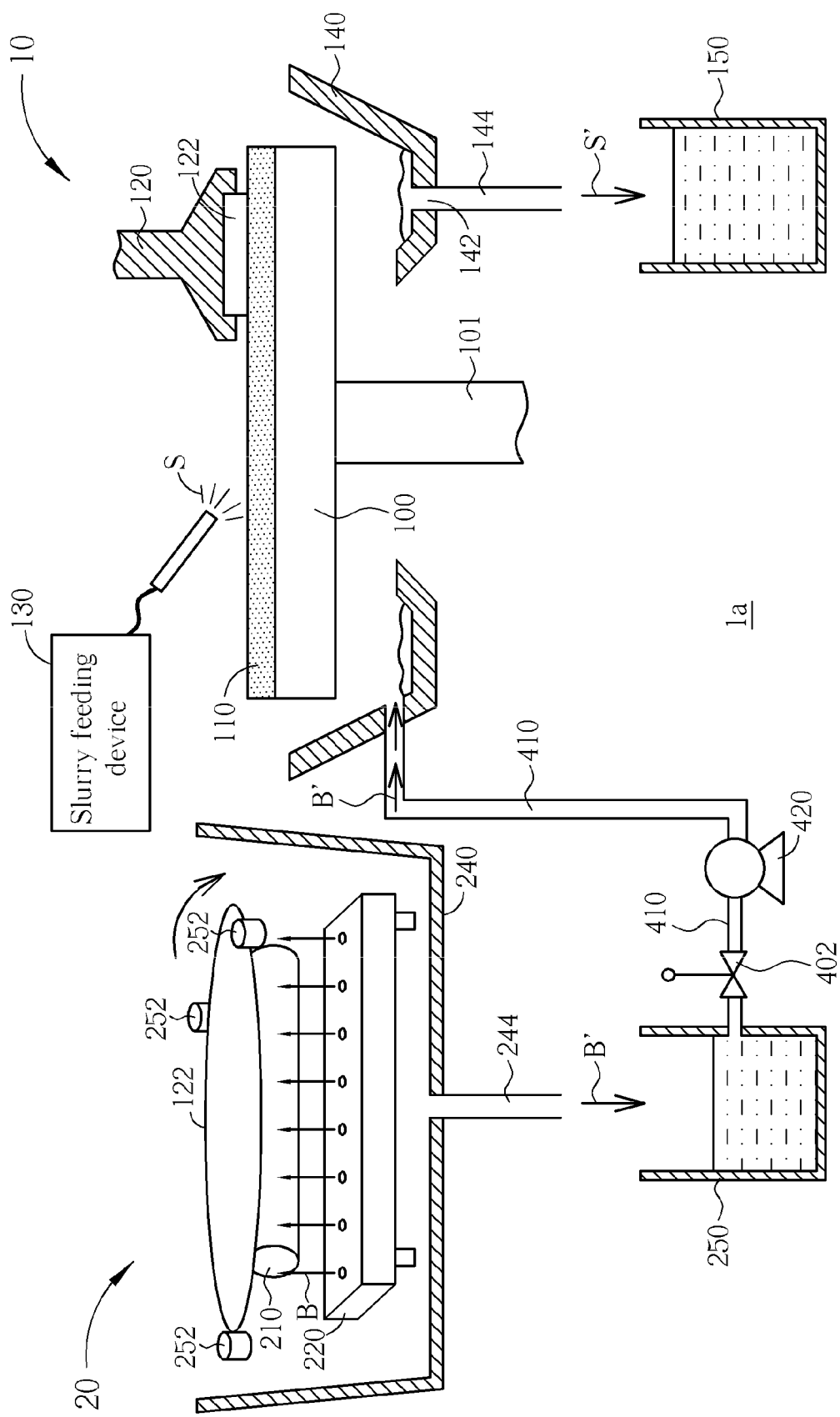
FIG. 2 is a schematic diagram showing germane parts of a CMP system in accordance with the second embodiment of the present invention.

FIG. 2 is a schematic diagram showing germane parts of a CMP system in accordance with the second embodiment of the present invention. As shown in FIG. 2, likewise, the CMP system 1a comprises at least a CMP wafer polishing unit 10 and a post-CMP cleaning unit 20, which may be configured together inside a cluster CMP tool, but not limited thereto. In general, the CMP wafer polishing unit 10 may comprise a platen 100 connected to a shaft 101 for rotating the platen 100 about its central axis during CMP process. A polishing pad 110 is mounted on the platen 100. A wafer 122 is held and rotated by a carrier 120. In polishing, a slurry feeding device 130 may spray slurry S onto the polishing pad 110. The rotating wafer 122 is pressed against the polishing pad 110 by the carrier 120 to cause relative movement between the polishing surface of the polishing pad 110 and the wafer 122, thereby producing a combined mechanical and chemical effect on the surface of the wafer. The once-used slurry S' may be received by a waste liquid sink 140 and then stored in a waste liquid tank 150 through the waste slurry drain piping 144.

After polishing, the wafer 122 is transferred to the post-CMP cleaning unit 20. In the post-CMP cleaning unit 20, the wafer 122 may be held and rotated by a plurality of rollers 252 with its surface to be cleaned facing the roller-shaped brush 210. The wafer 122 is scrubbed by the brush 210 to remove the slurry residues from the wafer surface. During the scrubbing and cleaning process, a base chemical B such as TMAH is simultaneously applied onto the surface of the wafer to be cleaned. Typically, the base chemical B is sprayed by a spray bar 220 that is disposed in proximity to the brush 210. According to the second embodiment of the invention, the once-used base chemical B' is received by the waste liquid sink 240 and stored in the collection tank 250 through the drain pipe 244. The collection tank 250 communicates with the waste liquid sink 140 of the CMP wafer polishing unit 10 via a connection conduit 410. A pump 420 is disposed in the connection conduit 410 to pump the once-used base chemical B' from the collection tank 250 to the waste liquid sink 140 of the CMP wafer polishing unit 10. Optionally, a control valve 402 may be disposed in the connection conduit 410 to control the entrance of the once-used base chemical B'. The waste liquid sink 140 and the waste slurry drain piping 144 of the CMP wafer polishing unit 10 can be washed by the once-used base chemical B', thereby preventing agglomeration or precipitation of abrasive particles and base chemical crystals and the polishing pad debris in the waste slurry drain piping 144 or clogs near the drain outlet 142.

Figure 3:
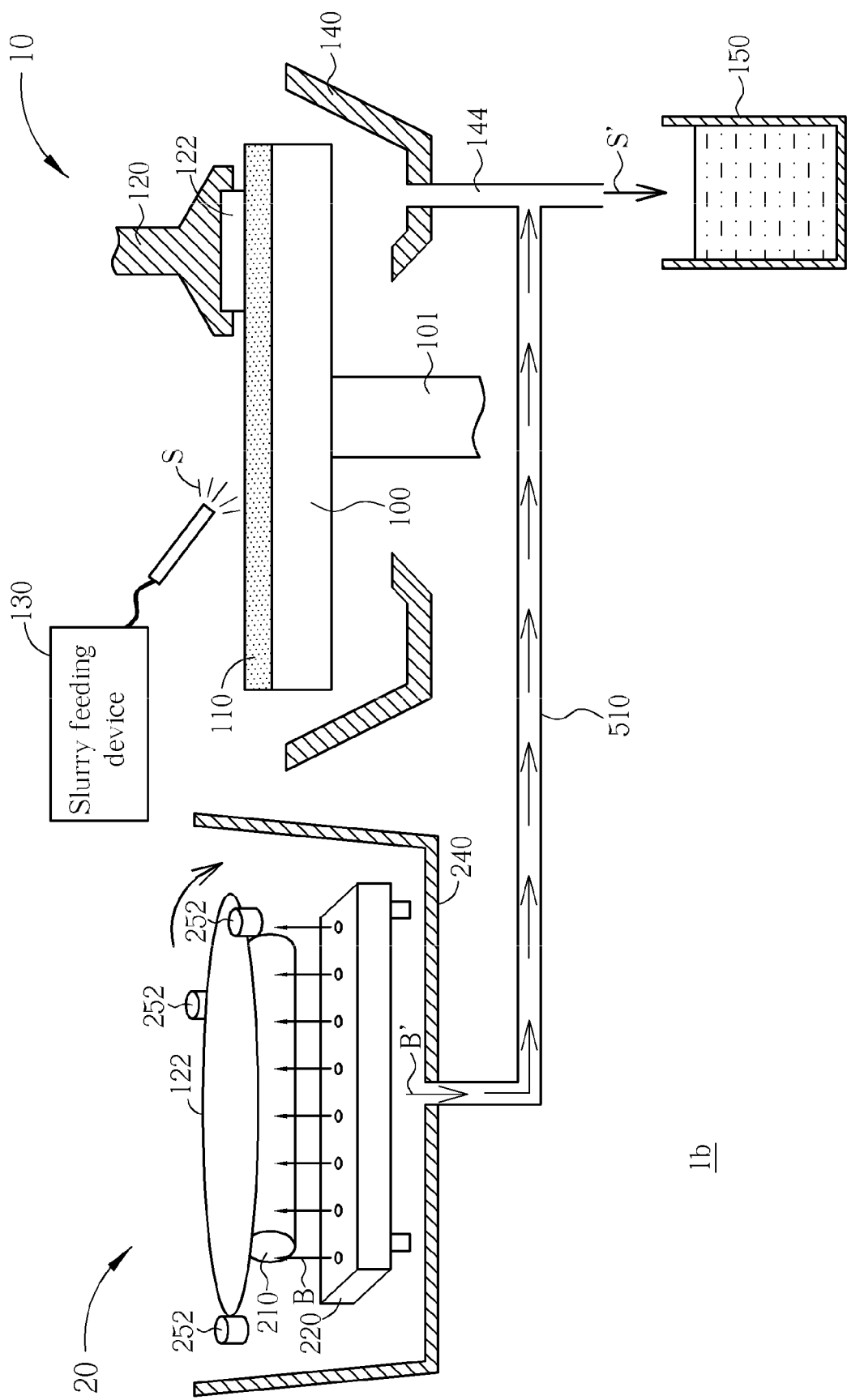
FIG. 3 is a schematic diagram showing germane parts of a CMP system in accordance with the third embodiment of the present invention.

FIG. 3 is a schematic diagram showing germane parts of a CMP system in accordance with the third embodiment of the present invention. As shown in FIG. 3, likewise, the CMP system 1b comprises at least a CMP wafer polishing unit 10 and a post-CMP cleaning unit 20, which may be configured together inside a cluster CMP tool, but not limited thereto. In general, the CMP wafer polishing unit 10 may comprise a platen 100 connected to a shaft 101 for rotating the platen 100 about its central axis during CMP process. A polishing pad 110 is mounted on the platen 100. A wafer 122 is held and rotated by a carrier 120. In polishing, a slurry feeding device 130 may spray slurry S onto the polishing pad 110. The rotating wafer 122 is pressed against the polishing pad 110 by the carrier 120 to cause relative movement between the polishing surface of the polishing pad 110 and the wafer 122, thereby producing a combined mechanical and chemical effect on the surface of the wafer. The once-used slurry S' may be received by a waste liquid sink 140 and then stored in a waste liquid tank 150 through the waste slurry drain piping 144.

After polishing, the wafer 122 is transferred to the post-CMP cleaning unit 20. In the post-CMP cleaning unit 20, the wafer 122 may be held and rotated by a plurality of rollers 252 with its surface to be cleaned facing the roller-shaped brush 210. The wafer 122 is scrubbed by the brush 210 to remove the slurry residues from the wafer surface. During the scrubbing and cleaning process, a base chemical B such as TMAH is simultaneously applied onto the surface of the wafer to be cleaned. Typically, the base chemical B is sprayed by a spray bar 220 that is disposed in proximity to the brush 210. According to the third embodiment of the invention, the waste liquid sink 240 of the post-CMP cleaning unit 20 does not directly communicates with the waste liquid sink 140 of the CMP wafer polishing unit 10. Instead, the once-used base chemical B' is drained by gravity from the waste liquid sink 240 of the post-CMP cleaning unit 20 to the waste slurry drain piping 144 of the CMP wafer polishing unit 10 via the conduit 510. In this case, only the waste slurry drain piping 144 of the CMP wafer polishing unit 10 is washed by the once-used base chemical B' every time the post-CMP cleaning unit 20 is operated.

Those skilled in the art will readily observe that numerous modifications and alterations of the device and method may be made while retaining the teachings of the invention.

What is claimed is:

1. A chemical mechanical polishing (CMP) system, comprising:
    a wafer polishing unit comprising a waste liquid sink for receiving a used slurry a waste slurry drain piping for draining the used slurry, a platen, a polishing pad mounted on the platen, a carrier for holding and rotating a wafer, and a slurry feeding device; and
        a post-CMP cleaning unit externally coupled to the wafer polishing unit, wherein the post-CMP cleaning unit comprises a waste liquid sink that is connected to the waste liquid sink of the wafer polishing unit through a conduit that guides a used base chemical from the post-CMP cleaning unit to flow toward the wafer polishing unit to wash at least the waste slurry drain piping every time the post-CMP cleaning unit is operated, and the post-CMP cleaning unit further comprises a plurality of rollers for supporting and rotating a wafer, a brush for scrubbing the wafer, and a spray bar disposed in proximity to the brush.

2. The CMP system according to claim 1 wherein the used base chemical comprises tetramethyl ammonium hydroxide (TMAH).

3. The CMP system according to claim 1 wherein the used base chemical from the post-CMP cleaning unit directly flows into the waste liquid sink of the wafer polishing unit.

4. The CMP system according to claim 1 wherein the used base chemical from the post-CMP cleaning unit does not flow into the waste liquid sink of the wafer polishing unit.

5. The CMP system according to claim 1 wherein used base chemical flows to the wafer polishing unit by gravity.

6. The CMP system according to claim 1 wherein the post-CMP cleaning unit is a scrubber cleaner.

7. The CMP system according to claim 1 wherein the used slurry is drained to a waste liquid tank.

* * * * *